United States Patent [19]

Ravaglia

[11] Patent Number: 4,622,737
[45] Date of Patent: Nov. 18, 1986

[54] PROCESS FOR THE FABRICATION OF A NONVOLATILE MEMORY CELL WITH VERY SMALL THIN OXIDE AREA AND CELL

[75] Inventor: Andrea Ravaglia, Bologna, Italy

[73] Assignee: SGS-ATES Componeti Electtronici S.p.A., Catania, Italy

[21] Appl. No.: 764,985

[22] Filed: Aug. 12, 1985

[30] Foreign Application Priority Data

Sep. 25, 1984 [IT] Italy ............................... 22812 A/84

[51] Int. Cl.⁴ .............................................. H01L 29/78
[52] U.S. Cl. ................................... 29/571; 29/576 W; 29/578; 148/1.5; 357/23.5
[58] Field of Search ................ 29/571, 576 W, 578; 148/1.5; 357/23.5, 23.11, 49, 59

[56] References Cited

U.S. PATENT DOCUMENTS 4,203,158  5/1980  Frohman-Beulchkowsky et al. ........................................ 357/23.5

FOREIGN PATENT DOCUMENTS 27543    2/1984  Japan ................................ 29/576 W
2107119  4/1983  United Kingdom ............... 357/23.5

Primary Examiner—Brian E. Hearn
Assistant Examiner—John T. Callahan
Attorney, Agent, or Firm—Cushman, Darby & Cushman

[57] ABSTRACT

On the doped area of a monocrystalline silicon substrate is grown a thick oxide layer a side portion of which is subjected to etching and underetching within a predetermined area until it uncovers an edge of silicon on which is then grown thin oxide; polycrystalline silicon layers separated by an oxide layer are then deposited to produce a nonvolatile memory cell in which the floating gate consisting of one of said polycrystalline silicon layers is separated from the underlying doped area of the substrate, which constitutes the drain, by a very small thin oxide area which adjoins an extended area of thick oxide. The electrical capacitance between the floating gate and the drain is thus reduced with resulting smaller dimensions of the cell for given performance.

3 Claims, 10 Drawing Figures

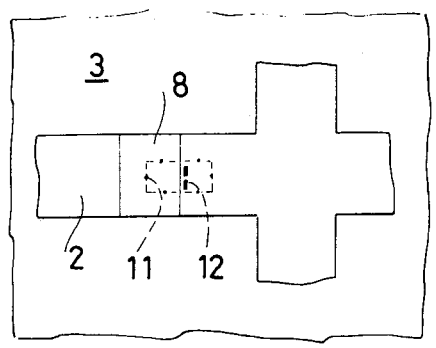
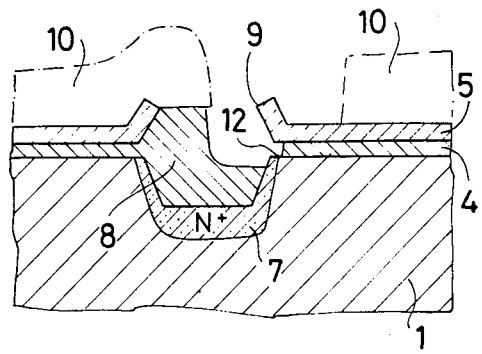
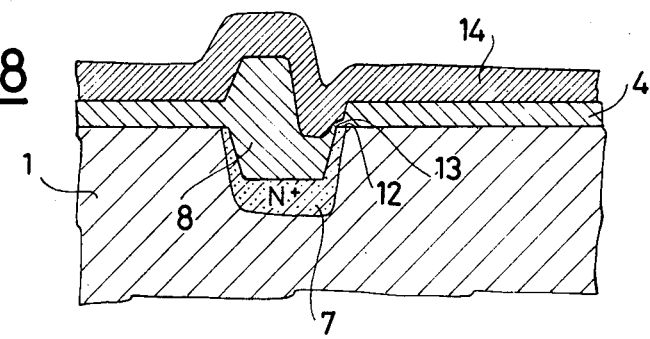
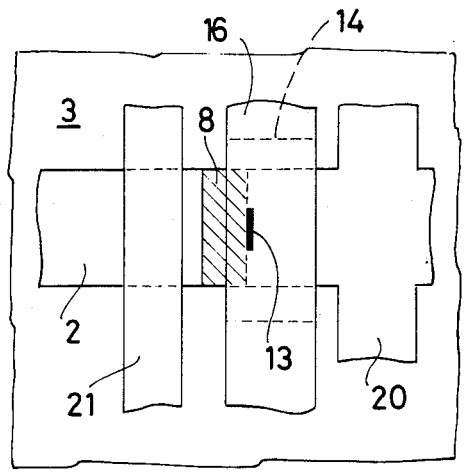
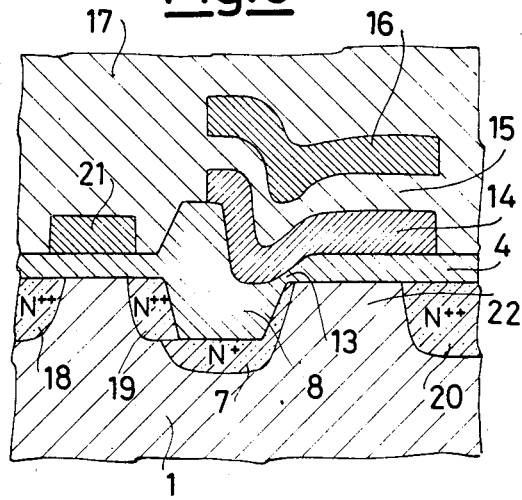

PROCESS FOR THE FABRICATION OF A NONVOLATILE MEMORY CELL WITH VERY SMALL THIN OXIDE AREA AND CELL

The present invention relates to a process for the fabrication of a nonvolatile memory cell with very small thin oxide area and the cell obtained by said process.

A conventional nonvolatile memory cell is known to include a floating polycrystalline silicon gate interposed between a polycrystalline silicon control gate and an underlying monocrystalline silicon substrate comprising a channel area and a pair of doped areas for drain and source. a first oxide layer separates the two gates and a second oxide layer is in turn interposed between the floating gate and the substrate. A portion of the floating gate extends further toward an underlying doped area to describe an interposed area of thin or tunnelling oxide the purpose of which is to facilitate the transfer of electrons from the doped area to the floating gate and vice versa for the ensuing load of the floating gate to a negative and positive potential respectively.

It is also known that in the above type of nonvolatile cell the floating gate potential should be as near as possible to that of the control gate and for this purpose the electrical capacitance between the two gates must be preponderant over that existing between the floating gate and the substrate. If the cell is to be held within acceptable dimensions it is necessary to work on the latter capacitance, reducing in particular the capacitance of the thin oxide area, which is the major one. Considering that to have adequate current load in the floating gate the thickness of the thin oxide must not exceed a certain maximum value, it is the transversal dimensions of the thin oxide area which require reducing.

The object of the present invention is to accomplish a fabrication process which will make it possible to obtain a nonvolatile memory cell having a very small thin oxide area.

According to the invention said object is achieved by means of a process characterized in that it comprises:

(a) preparation of a monocrystalline silicon substrate covered with an oxide layer and a nitride layer;

(b) etching of said oxide and nitride layers in a predetermined doped area of the underlying silicon substrate in said area;

(c) growth of thick oxide on said doped area of said silicon substrate;

(d) etching of a side portion of predetermined dimensions of said thick oxide with underetching of the nitride layer until a portion of an edge of the underlying doped area of the silicon substrate is uncovered;

(e) etching of the nitride layer;

(f) growth of thin oxide on said uncovered edge of the silicon substrate;

(g) final deposit of a first and second layer of polycrystalline silicon with interposition of a layer of oxide.

A nonvolatile memory cell is thus obtained which has the floating gate and the control gate made up respectively of the first and second polycrystalline silicon layers and has in particular a very small thin oxide area which is defined in one direction by the dimensions of the thick oxide etching area, i.e of a conventional lithography, and in the other direction by an underetching which, by uncovering only an edge of the silicon substrate, allows openings up to ten times smaller than those obtainable with lithography. A broad area of thick oxide remains to cover the remaining doped area of the substrate, which comprises the drain area. As a result there is a clear decrease in the capacitive etching between the floating and drain gates which makes possible containment of the capacitance between the two gates and, for a given performance, a smaller cell.

Reduction of the thin oxide area also reduces the defectiveness of the thin oxide as regards yield. The thick oxide makes it possible to use a lightly doped drain area on which good quality thin oxide can be grown.

With the process according to the invention it is therefore possible to obtain a small nonvolatile memory cell and at the same time good quality and efficiency.

BRIEF DESCRIPTION OF THE DRAWINGS

The various steps of the process according to the invention are illustrated for greater clarity and as an example in the annexed drawings wherein:

FIG. 6 shows the structure of FIG. 5 after etching of a side portion of the thick oxide with penetration under the nitride layer and underetching up to the uncovered portion of an edge of the doped area of the silicon substrate;

FIG. 7 shows the structure of FIG. 6 in plan view from above;

FIG. 8 shows the structure of FIG. 6 after etching of the nitride layer, growth of thin oxide on the uncovered edge of the substrate and deposit of a first layer of polycrystalline silicon;

FIG. 9 shows the structure of FIG. 8 at the end of the subsequent final steps of the process, i.e. it shows the nonvolatile memory cell obtained with the described process;

FIG. 10 shows a plan view from above of the final structure of said nonvolatile memory cell before the conclusive finishing operations.

Figure 1:
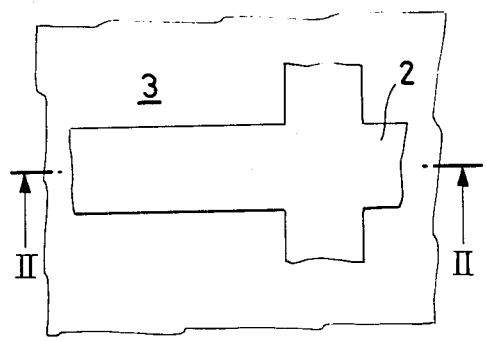
FIG. 1 shows a plan view from above of a monocrystalline silicon substrate previously subjected to masking of the active area and to growth of the surrounding field oxide.
Figure 2:
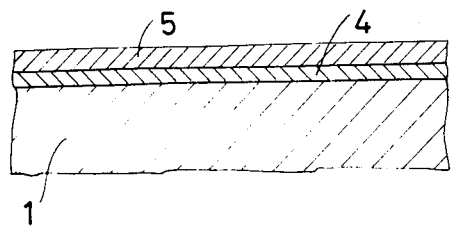
FIG. 2 shows a cross section of said substrate along plane of cut II-II of FIG. 1 after covering of the active area with a layer of oxide and a layer of nitride.

The process according to the invention as illustrated in the drawings calls for use of a substrate of silicon 1 which is first covered with a layer of silicon oxide and a layer of silicon nitride and then subjected to masking to isolate the active areas 2 and then to field oxide growth 3 in the surrounding areas (FIG. 1). The active areas 2 are thus covered with a layer of silicon oxide 4 and with a layer of silicon nitride 5 (FIG. 2).

Figure 4:
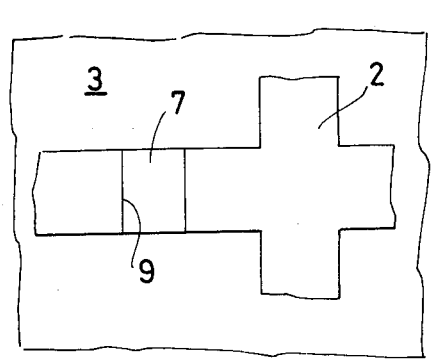
FIG. 4 shows the same structure in plan view from above.
Figure 3:
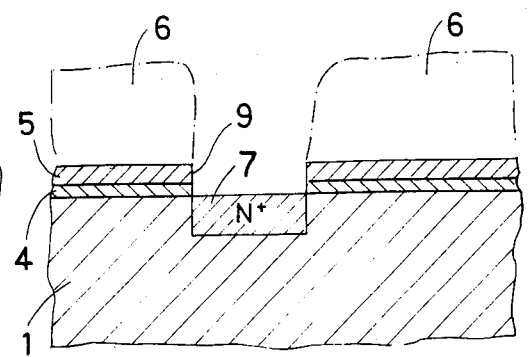
FIG. 3 shows the structure of FIG. 2 after etching of the oxide and nitride layers in a predetermined area and doping of the underlying silicon substrate in said area.

The structure thus prepared is then subjected to chemical etching in a predetermined area enclosed with protective resist 6 (FIG. 3) and in said area is diffused in the substrate 1 an N+ doping which describes a doped area 7 (FIGS. 3 and 4) designed to act as the drain in the finished cell.

Figure 5:
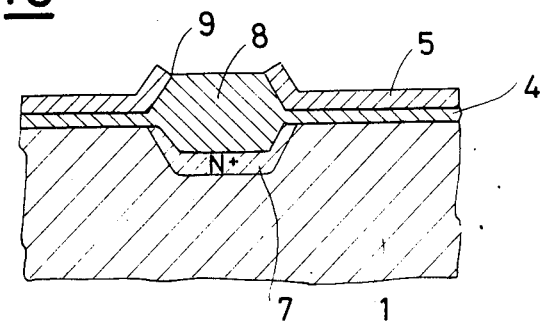
FIG. 5 shows the structure of FIG. 3 after growth of the thick oxide on the doped area of the substrate.

As shown in FIG. 5, on the doped area 7 is then grown a thick oxide layer 8 of approximately the same breadth as the "window" 9 opened in the nitride layer 5.

With the aid of the resist 10 the thick oxide 8 is then subjected to chemical etching in a side portion described by a "window" 11 illustrated in dot-dash lines in FIG. 7. The etching is continued until it penetrates under the nitride layer 5, thus accomplishing an underetching which has the effect of uncovering an edge 12 of the underlying doped area 7 of the silicon substrate (FIG. 6). The uncovered edge is indicated by a heavy broken line in FIG. 7.

The nitride is then subjected to selective chemical etching with respect to the silicon and the oxide and on the edge 9 is then grown thin or tunnelling oxide 13 (FIG. 8).

The process then continues in the conventional manner with deposit of a first polycrystalline silicon layer 14 designed to become the floating gate of the cell (FIG. 8), masking of said layer 14, growth of oxide 15, deposit of a second polycrystalline silicon layer 16, masking of said layer 16, and further oxide growth 17.

Thus is obtained the final cell structure shown in FIG. 9 with the thin oxide 13 adjoining the thick oxide 8 and with the cell transistor channel area 22 which may then be completed with a selection or transfer gate 21 and with further N++ doping areas 18, 19 and 20 to accomplish a complete nonvolatile memory cell equipped with an auxiliary selection element made up of the gate 21 and the underlying doped areas.

The final structure of the memory cell is also illustrated in FIG. 10 wherein the thick oxide 8 is indicated with a broken line and the thin oxide 13 (e.g. 100 angstrom thick) is indicated with a heavy line which makes clear its considerably reduced size, particularly in the direction described by the underetching. The conventional conclusive finishing operations such as metallization and passivation remain to be performed.

It appears more clearly from FIG. 10 that the structure obtained is the polycrystalline silicon autoaligned two-level type.

It is also possible to make the floating gate 14 autoaligned with the active area 2 of the substrate. In this case however the growth of the field oxide must take place after deposit of the first polycrystalline silicon layer. The sequence must therefore be as follows:

substrate oxidation and nitride deposit;
masking and spread of the N++ doping;
thick oxide growth and etching with underetching;
thin-oxide growth;
first polycrystalline silicon layer deposit;
nitride oxidation and deposit;
masking of the active areas, implantation and oxidation of the field;
masking of the first polycrystalline silicon layer;
final operations as for the process illustrated in the drawings.

It should be noted that the process according to the invention (with or without the floating gate autoaligned with the active substrate area) may be used not only for the fabrication of a nonvolatile cell with conventional thin oxide of the type illustrated in the drawings but also for the fabrication of a so-called "merged" cell, i.e. a nonvolatile memory cell which has the control gate made in a single piece with selection or transfer gate such as the one indicated by reference number 21 in FIG. 9.

I claim:

1. Process for the fabrication of a nonvolatile memory cell with very small thin oxide area characterized in that it comprises:
   (a) preparation of a monocrystalline silicon substrate of a first conductivity type covered with a layer of oxide and a layer of nitride;
   (b) etching of said oxide layer and said nitride layer in a predetermined area and doping of the underlying silicon substrate with an opposite conductivity type modifier in said area;
   (c) growth of thick field oxide on said doped area of the silicon substrate;
   (d) etching of a side portion of predetermined dimensions of said thick field oxide with underetching under the nitride layer until an edge of the underlying doped area of the silicon substrate is exposed;
   (e) etching of the nitride layer;
   (f) growth of thin oxide over said uncovered edge of the silicon-substrate to form a floating gate oxide;
   (g) final deposit of a first floating gate and a second control gate layer of polycrystalline silicon on said thin oxide with interposition between said first floating gate and said second control gate of an oxide layer.

2. Process according to claim 1 characterized in that the monocrystalline silicon substrate is first prepared by making the active areas and growth of field oxide around the active areas.

3. Process according to claim 1 characterized in that it calls for masking of the active areas of the monocrystalline silicon layer and growth of field oxide after deposit of the first polycrystalline silicon layer.

* * * * *